United States Patent [19]

Ohashi et al.

[11] Patent Number: 5,208,628
[45] Date of Patent: May 4, 1993

[54] IMAGE FORMING APPARATUS

[75] Inventors: Kunio Ohashi; Shoichi Nagata, both of Nara, Japan

[73] Assignee: Sharp Kabushiki Kaisha, Osaka, Japan

[21] Appl. No.: 859,261

[22] Filed: Mar. 25, 1992

Related U.S. Application Data

[63] Continuation of Ser. No. 609,099, Oct. 31, 1990, abandoned, which is a continuation of Ser. No. 296,450, Jan. 12, 1989, abandoned.

[30] Foreign Application Priority Data

Jan. 14, 1988 [JP] Japan .................................. 63-6672
Jan. 14, 1988 [JP] Japan .................................. 63-6675

[51] Int. Cl.$^5$ ............................................. G03B 27/32
[52] U.S. Cl. ..................................................... 355/27
[58] Field of Search ................... 355/27, 28, 32, 285, 355/311; 430/138; 219/216

[56] References Cited

U.S. PATENT DOCUMENTS

| | | |
|---|---|---|
| 4,399,209 | 8/1983 | Sanders et al. |
| 4,549,803 | 10/1985 | Ohno et al. ................ 355/285 |
| 4,714,943 | 12/1987 | Sakakibara et al. ........... 355/27 |
| 4,905,036 | 2/1990 | Asano et al. ................. 355/27 |
| 4,931,618 | 6/1990 | Nagata et al. ............... 219/216 |

FOREIGN PATENT DOCUMENTS

| | | |
|---|---|---|
| 58-88739 | 5/1983 | Japan . |
| 62-6257 | 1/1987 | Japan . |
| 62-209535 | 9/1987 | Japan . |
| 62-209536 | 9/1987 | Japan . |

*Primary Examiner*—Michael L. Gellner
*Assistant Examiner*—Khanh Dang
*Attorney, Agent, or Firm*—Morrison & Foerster

[57] ABSTRACT

An image forming apparatus makes use of a photosensitive sheet having a surface coated with microcapsules encapsulating a light-curable agent and a colorless dye and an image transfer sheet having one surface coated with a developing agent having an chromogenic effect on the encapsulated colorless dye. These sheets are superposed one on top of the other and pressed together by a compression device to selectively rupture the microcapsules on the photosensitive sheet, forming a visible image on the image transfer sheet which is thereafter heated by a heating device. Either the speed at which the image transfer sheet is passed through the compression device or the temperature at which the image transfer sheet is heated by the heating device is controlled according to a characteristic of the image transfer sheet such as its thickness, electrostatic capacity and light transmissivity.

4 Claims, 8 Drawing Sheets

IMAGE FORMING APPARATUS

CROSS REFERENCES

This application is a continuation of earlier filed U.S. application Ser. No. 07/609,099, filed Oct. 31, 1990 (now abandoned), which application is a continuation of earlier filed U.S. application Ser. No. 07/296,450, filed Jan. 12, 1989 (now abandoned), which applications are incorporated herein by reference and to which applications we claim priority under 35 USC §120, and are based on Japanese applications 63-6672 and 63-6675, both filed Jan. 14, 1988, which applications are incorporated herein by reference and to which applications we claim priority under 35 USC §119.

BACKGROUND OF THE INVENTION

This invention relates to an image forming apparatus which forms images by superposing a photosensitive sheet with one surface coated with microcapsules encapsulating a colorless dye and a light-curable agent which hardens by exposure to light and an image transfer sheet with one surface coated with a developing agent having a chromogenic effect on this colorless dye and pressing them together.

Japanese Patent Publication Tokkai 58-88739 discloses a method of forming images by using a photosensitive sheet. The photosensitive sheet used by this method is characterized as having a sheet-like light-transmissive base material, for example, of polyester coated with microcapsules encapsulating a colorless dye of a specified kind and a light-curable agent which hardens when exposed to light. If a photosensitive sheet like this is exposed to image-forming light such as reflected light from a document, only those of the microcapsules on the sheet which are exposed to light are hardened and a latent image corresponding to the image carried by the light is thereby formed on the photosensitive sheet. If an image transfer sheet with one surface of its base sheet coated with a developing agent having a chromogenic effect on the colorless dye in the microcapsules is superposed on such a photosensitive sheet having a latent image formed thereon and if they are then pressed together, those of the microcapsules which have not been hardened rupture, causing the colorless dye encapsulated therein to flow out thereof and to react with the developing agent on the image transfer sheet to form a visible image corresponding to the latent image. Examples of the base sheet for an image transfer sheet include thin sheets of unit weight less than about 90 g/m$^2$, thick sheets of unit weight greater than about 120 g/m$^2$ and light-transmissive sheets which can serve as originals for an overhead projector (OHP).

In order to rupture the microcapsules which have not been hardened on a photosensitive sheet described above, a high pressure on the order of 25–125 kg/cm is required and use is usually made of a compressing device with a pair of pressure rollers for applying such a high pressure. Such compression devices have been disclosed, for example, in U.S. Pat. No. 4,399,209 and Japanese Patent Publication Tokkai 62-6257.

When a photosensitive sheet and an image transfer sheet are superposed and pressed together to rupture those of the microcapsules on the photosensitive sheet which have not been hardened, the resultant color image may have different density from what is expected if pressure is not applied stably and the microcapsules are not ruptured dependably. Even if the same compression device is used, density may be low if the image transfer sheet is thin while density may be high if a thick image transfer sheet is used. Japanese Patent Publications Tokkai 62-209535 and 62-209536, for example, have disclosed methods of controlling the rotational speed of the pressure rollers and the magnitude of applied pressure according to the density of the original, image density inputted by means of density selection switches, etc. With these methods, however, changes cannot be effected instantly corresponding to the changes in the condition of compression due to changes in the thickness of the image transfer sheet, which is usually determined by the kind of its base sheet.

For the purpose of providing lustre to the image formed on the image transfer sheet, it is known to preliminarily coat the sheet with a thermoplastic resin material and to heat the sheet after a visible image is transferred thereonto, thereby melting and softening the surface-coating resin and covering the visible image therewith. Examples of heating method for thus providing lustre to an image transfer sheet include the oven method whereby the image transfer sheet with an image formed thereon and being transported is indirectly heated from above by a heater, the heat roller method whereby the image transfer sheet with an image formed thereon is passed between a heat roller enclosing therein a heat source such as a halogen lamp and a pressure roller compressed against the heat roller, and the belt method whereby heating is effected by means of a heat-resistant belt wound around a similar heat roller enclosing therein a heat source such as a halogen lamp.

As explained above, however, the thickness of the image transfer sheet is not constant because base sheets of various thicknesses are used and light-transmissive sheets capable of serving as originals for an overhead projector (OHP) must also be accommodated. Moreover, the proper amount of heat required to give lustre to the image transfer sheet depends on its material characteristics as well as its thickness. If the heating is effected at the same temperature by any of the methods described above, the resultant lustre becomes uneven in the case of paper sheets and the light transmissivity becomes non-uniform in the case of original transparencies for an overhead projector (OHP).

SUMMARY OF THE INVENTION

It is therefore a principal object of the present invention to provide an image forming apparatus with which the problems of prior art image forming apparatus described above can be eliminated.

An image forming apparatus according to the present invention is of the type which makes use of a photosensitive sheet having a surface of its sheet-like base material coated with microcapsules encapsulating a light-curable agent and a colorless dye and an image transfer sheet having a surface coated with a developing agent having a chromogenic effect on this colorless dye, superposing them one on top of the other and compressing them together by means of a compressing device so as to rupture those of the microcapsules which have not been hardened and to thereby form a visible image on the image transfer sheet and then heating this image transfer sheet by means of a heating device. It is characterized as comprising a control means for controlling either the speed of the image transfer sheet passing through the heating device or the heating temperature by this heating device so as to achieve the aforementioned object of the present invention According to a preferred embodiment of the present invention, the speed of the image transfer sheet passing through the heating device is set by operating a specified switch. According to another preferred embodiment of the present invention, the speed of the image transfer sheet passing through the heating device is set according to a characteristic of the image transfer sheet. According to a particular embodiment of the present invention, the aforementioned characteristic is based on the electrostatic capacity of the image transfer sheet. According to another particular embodiment of the present invention, the aforementioned characteristic is based on the electrical resistance of the image transfer sheet. According to still another particular embodiment of the present invention, the aforementioned characteristic is based on the light transmissivity of the image transfer sheet. According to still another particular embodiment of the present invention, the aforementioned characteristic is based on the light reflectivity of the image transfer sheet. According to still another particular embodiment of the present invention, the aforementioned characteristic is the thickness of the image transfer sheet. According to still another particular embodiment of the present invention, the aforementioned characteristic is the material of the base sheet of the image transfer sheet. According to still another preferred embodiment of the present invention, the aforementioned control means increases the speed of the image transfer sheet through the heating device if the sheet is thick. According to still another preferred embodiment of the present invention, the aforementioned control means decreases the speed of the image transfer sheet through the heating device if the sheet has high light transmissivity. According to still another preferred embodiment of the present invention, the image transfer sheet has one surface thereof coated with a thermoplastic material as well as the developing agent and the control means increases the temperature of the heating device if the image transfer sheet is thick. According to still another preferred embodiment of the present invention, the image transfer sheet has one surface thereof coated with a thermoplastic material as well as the developing agent and the control means increases the temperature of the heating device if the light transmissivity of the image transfer sheet is high.

With an image forming apparatus thus structured, the speed at which the image transfer sheet is passed through the compression device is varied correspondingly according to the characteristics of the sheet such that it is possible to obtain high-quality images without unevenness in image density all times even if image transfer sheets with different thicknesses and material qualities are used. In the case of a thick sheet, the speed of image formation can be increased. The temperature of heating the image transfer sheet after a visible image is formed thereon can be varied according to the characteristics of the transfer sheet such good images with no lustre unevenness can be obtained even if sheets with different thicknesses and material characteristics are used. In the case of image transfer sheets with a light-transmissive base sheet, it is possible to obtain images with stable light transmissivity.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

In all these figures, components which are substantially identical or at least function nearly identically are indicated by the same numerals and are not separately explained.

DESCRIPTION OF PREFERRED EMBODIMENTS

Figure 1:
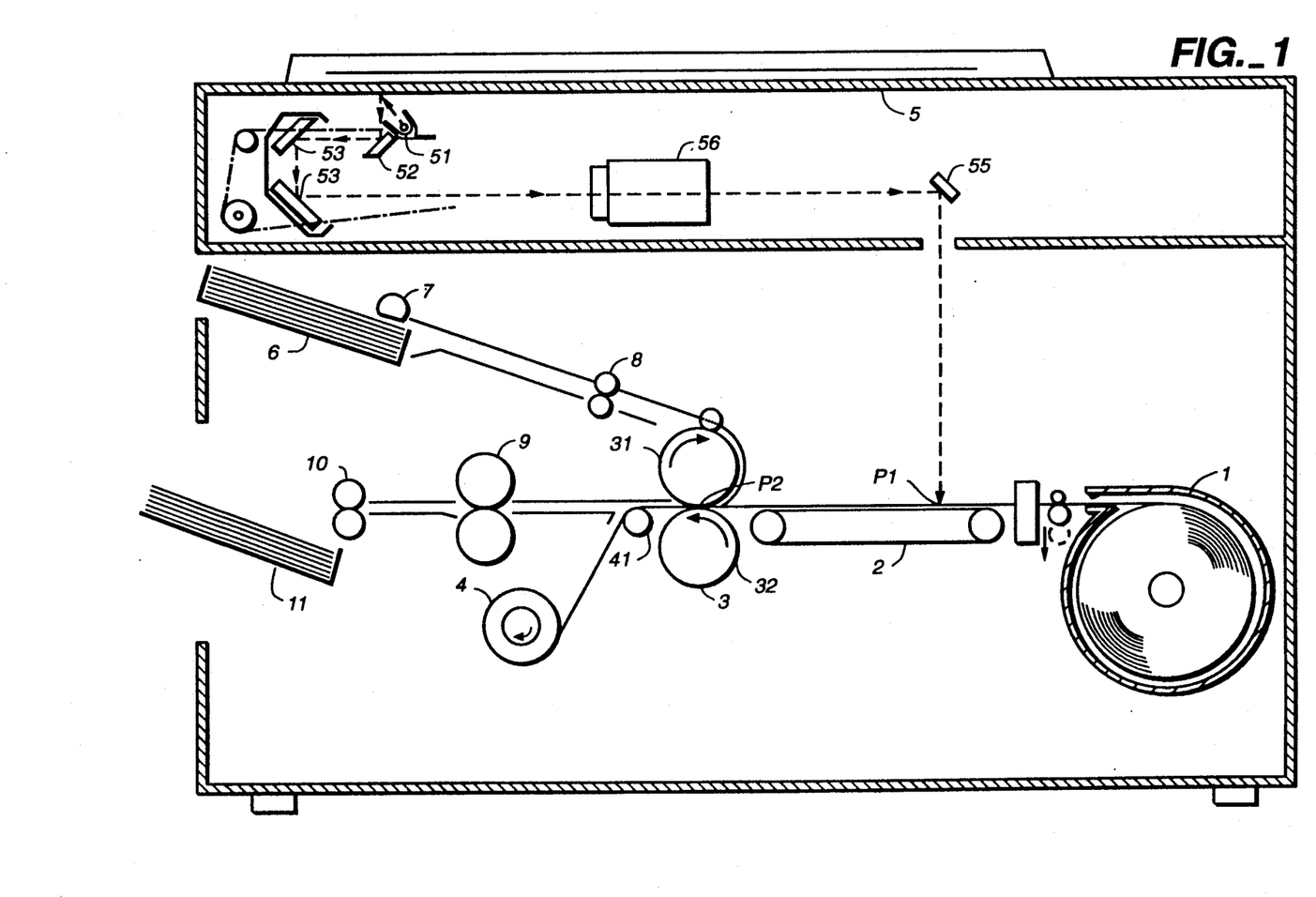
FIG. 1 is a schematic front sectional view for showing the structure of an image forming apparatus embodying the present invention.

As shown schematically in FIG. 1, a copier as an example of image forming apparatus embodying the present invention contains at one side section within its housing structure a cassette 1 storing therein a photosensitive sheet having one surface of a sheet-like base material coated with microcapsules encapsulating a colorless dye and a light-curable agent which hardens upon exposure to light. The photosensitive sheet is pulled out of this cassette 1 horizontally with its microcapsule-coated surface facing in the upward direction and is wound up by a take-up roller 4 through a supporting table 2, a compression device 3 and a transportation roller 41. A document table 5 for supporting thereon a document to be copied is formed on the top surface of the housing structure. Below this document table 5 is an optical system including a light source 51, mirrors 52-55 and a lens 56. The optical system serves to expose and scan the document on the document table 5 and to direct the reflected light therefrom to an exposure point P1 specified on the part of the photosensitive sheet on the supporting table 2 such that a latent image is formed on the photosensitive sheet by the microcapsules which are selectively hardened by this image-forming light from the document.

A paper cassette 6 containing image transfer sheets therein is removably attached to the side of the housing structure opposite from the cassette 1 for containing the photosensitive sheet. The image transfer sheets have a surface of their sheet-like base materials coated with a developing agent having a chromogenic effect on the colorless dye inside the microcapsules on the photosensitive sheet. The paper cassette 6 may contain image transfer sheets of a thin kind, an ordinary kind or a thick kind as well as transparent sheets for serving as an original for an overhead projector. The image transfer sheets inside the paper cassette 6 are sequentially taken out thereof by the operation of a feed roller 7 and transported to a timing roller 8 which serves to direct the incoming image transfer sheets to the compression device 3 at a specified timing. The compression device 3 is comprised of a pair of pressure rollers 31 and 32 which are pressed against each other by means of a compression mechanism (not shown). The photosensitive sheet, after a latent image is formed thereon, is passed between these pressure rollers 31 and 32 and an image transfer sheet which is delivered to the compression device 3 is superposed on the photosensitive sheet at a pressure point P2 where they are pressed together such that those of the microcapsules on the photosensitive sheet which have not been hardened are ruptured, causing the colorless dye contained therein to flow out thereof and thereby forming a visible image on the image transfer sheet. After passing through the compression device 3, the image transfer sheet is separated from the photosensitive sheet, heated by heat rollers 9 and then discharged onto a discharge tray 11 by means of discharge rollers 10. As disclosed, for example, in Japanese Patent Publication Tokkai 61-24495, the chromogenic reaction for forming the visible image on the image transfer sheet is accelerated by the heating with the heat rollers 9. If the image transfer sheet is preliminarily coated also with a thermoplastic pigment, the pigment becomes soft or melted by the heat from the heat rollers 9 and covers the surface of the chromogenic image to thereby give lustre thereto as disclosed, for example, in Japanese Patent Publication Tokkai 60-259490.

The pressure rollers 31 and 32 of the compression device 3 are coaxially disposed and are adapted to compress the photosensitive and image transfer sheets together along a line (at the pressure point P2) parallel to their axes of rotation. The pressure applied thereby is about 25–125 kg/cm. These pressure rollers are rotated by being connected to a driving mechanism (not shown) and the speed at which the image transfer sheet passes through the compression device 3 is approximately the same as the speed of rotation of the pressure rollers. The distance between the exposure point P1 and the pressure point P2 is greater than the length of the size A3 paper and the photosensitive sheet is delivered to the pressure point P2 to be compressed between the pressure rollers only after an image-forming exposure thereof at the exposure point P1 is completed. Accordingly, the speed at which the photosensitive sheet is exposed and the speed at which the photosensitive and image transfer sheets are passed together between the pressure rollers can be set differently.

Figure 2:
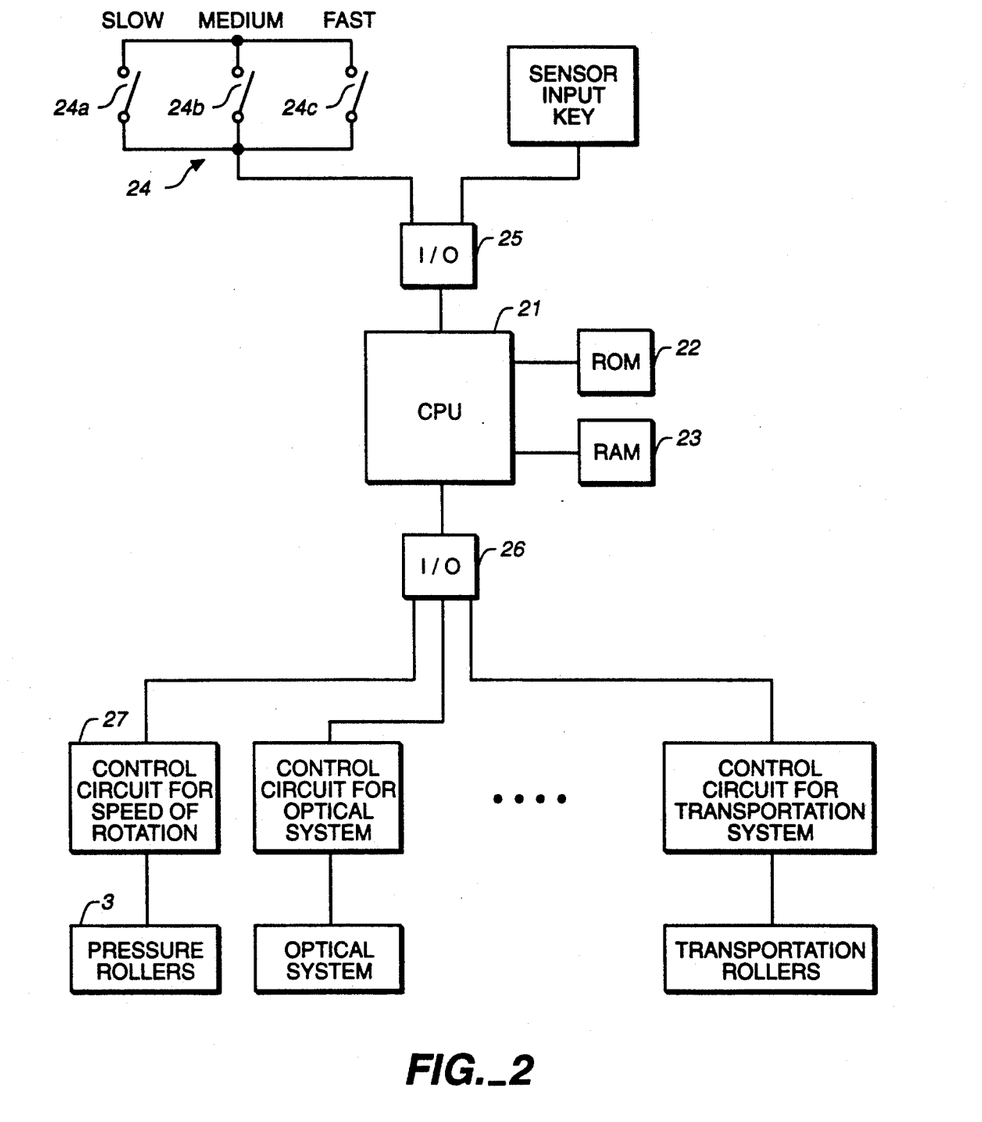
FIG. 2 is a block diagram of the control system of the apparatus of FIG. 1.

With reference next to FIG. 2 which shows the control system of the copier, a central processing unit (CPU) 21 serves to control its overall operation and its control program is preliminarily stored in a read-only memory (ROM) 22, using a random-access memory (RAM) 23 as working areas in its execution. Although not shown in the figures, there is a control panel provided on the top surface of the housing structure, inclusive of an operating section having switches such as speed input switches 24 as well as a display section for displaying inputted data, etc. The speed input switches 24 are for setting and inputting a speed at which the photosensitive and image transfer sheets pass through the compression device 3 and include a low-speed switch (Slow) 24a, a medium-speed switch (Medium) 24b and a high-speed switch (Fast) 24c. The information inputted through the on-off operations of the speed input switches 24 is received by the CPU 21 through an I/O interface 25. In response, the CPU 21 outputs control data through another I/O interface 26 to a roller speed control circuit 27. The pressure rollers rotate at a speed corresponding to the inputted speed data.

Next, the relationship between the speed at which the image transfer sheet passes through the compression device and the density of the image chromogenically formed on the image transfer sheet is explained.

Tests were conducted by using a copier described above to form images on image transfer sheets with an ordinary base sheet of about 110 g/m$^2$. The speed of the image transfer sheet through the compression device was varied among the aforementioned three levels and the grayscale (density 0.05–1.85 with pitch of 0.10) of obtained images was examined. The results are shown in FIG. 3 by way of a graph with the horizontal axis indicating exposure corresponding to the grayscale density and the vertical axis indicating the (relative) density of the chromogenically formed image on the image transfer sheet.

Figure 3:
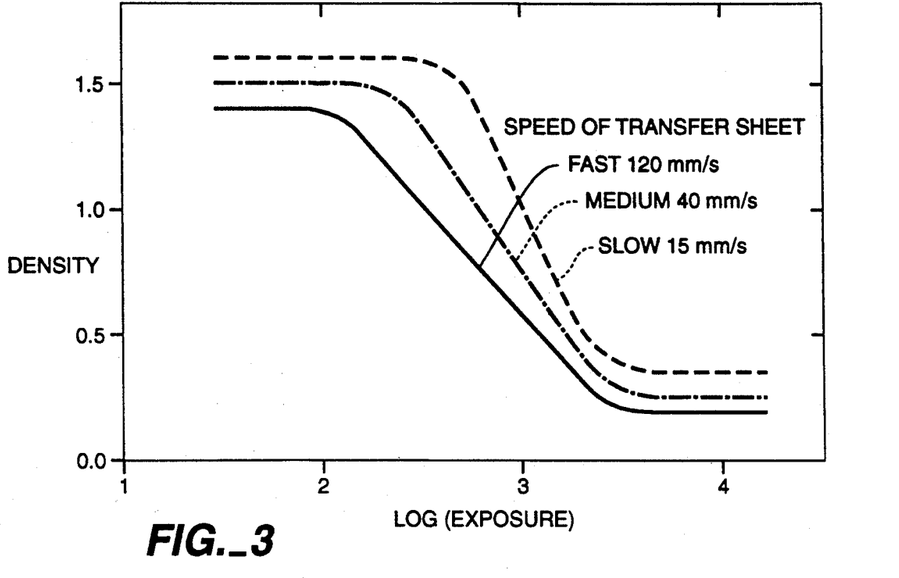
FIG. 3 is a graph showing the relationship between the speed of an image transfer sheet between pressure rollers and the image density formed on the sheet.

The graph of FIG. 3 clearly shows a tendency that, as the speed of passing between the pressure rollers is decreased, the maximum density of the chromogenic image becomes higher, the minimum density of the chromogenic image becomes higher, and the value of gamma representing the gradation reproducibility of the image (slope of the curve showing the relationship between the light exposure on the document and the density of the chromogenic image) becomes larger to produce a hard-tone image. Accordingly, a low speed should generally be selected when a relatively hard image is desired on the image transfer sheet or when it is desired to increase the image density. Correspondingly, a high speed should be selected in opposite situations.

Figure 4:
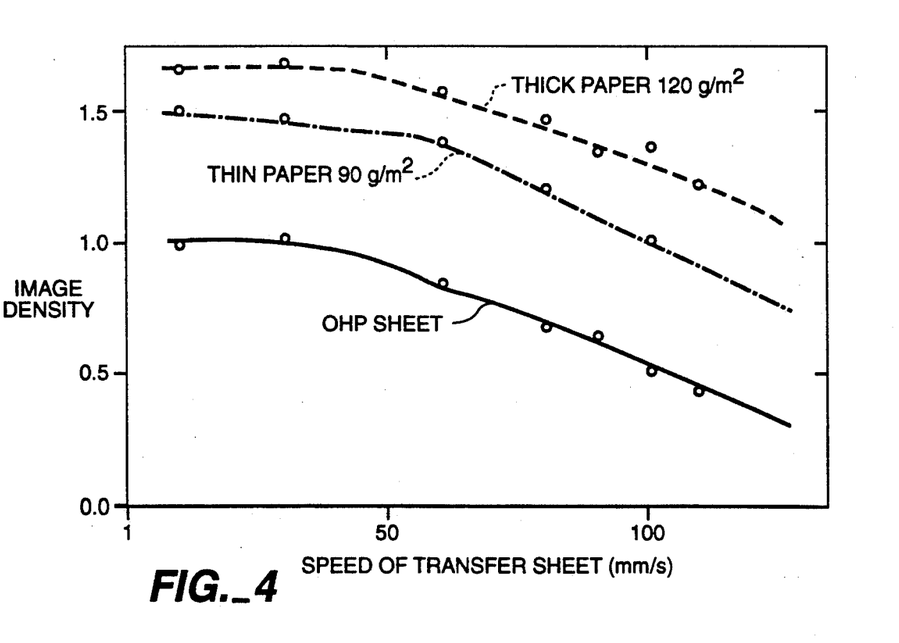
FIG. 4 is a graph showing for image transfer sheets of different types the relationships between the speed of the sheet between pressure rollers and the image density formed thereon.

The relationship between the speed of the image transfer sheet through the compression device and the density of the image formed thereon itself varies, depending on the thickness of the image transfer sheet. For this reason, tests were further conducted by using image transfer sheets of different types using as sheet-like base materials thick paper of 120 g/m$^2$ and thin paper of 90 g/m$^2$ and transparent sheets for OHP originals. FIG. 4 shows the results of these tests, the horizontal axis indicating the speed of the image transfer sheet passing through the compression device and the vertical axis indicating the maximum density (relative value) of the image formed on the image transfer sheet, that is, the maximum density of the part of the photosensitive sheet where microcapsules have not hardened. The curves for the image transfer sheets with thin and thick base sheets were obtained by measured reflected density. The result for the transparent OHP original sheet was obtained by measuring the transmissive density because it is transmissivity that is of importance with OHP original sheets.

FIG. 4 shows that a density level of 1.4 or greater can be obtained in the case of an image transfer sheet with a thick base sheet, even if the pressure from the pressure roller is increased and the speed of the transfer sheet passing through the compression device is as high as about 90 mm/sec but that the image density begins to drop below the level of 1.4 and the image quality to be adversely affected in the case of thin transfer sheets if the speed is about 60 mm/sec or greater. If use is made of an image transfer sheet with thick paper (about 120 g/m$^2$ or heavier) as its base, therefore, the speed of copying can be increased without reducing the image density by increasing the speed of the image transfer sheet through the compression device to about 90 mm/sec. In the case of an image transfer sheet with thin paper (about 60-100 g/m$^2$) as its base, on the other hand, it is desirable to reduce its speed through the compression device to about 60 mm/sec or less such that the quality of the image is not adversely affected. In the case of an image transfer sheet with a base sheet of about 100-120 g/m$^2$, it is desirable to set the speed through the compression device to about 60-90 m/sec.

In the case of an image transfer sheet using as its base material a light-transmissive sheet usable as an OHP original, a good projected image is obtainable with an OHP if its transmissive density is about 0.8 or greater but contrast is lost from the projected image and its quality becomes poor if the transmissive density is below about 0.8 FIG. 4 shows that the density becomes less than 0.8 if the speed of the image transfer sheet through the compression device becomes greater than 60 mm/sec. For this reason, it is desirable to keep this speed at less than about 60 mm/sec in the case of an image transfer sheet using a transparent OHP original sheet as its base material.

With reference to the copier described above, if the low-speed switch 24a on the control panel is operated, the CPU 21 outputs a corresponding signal through the I/O interface 26 to the roller speed control circuit 27 so as to rotate the pressure rollers at an appropriate rate below 60 mm/sec. If the medium-speed switch 24b is operated, the pressure rollers are rotated at an appropriate rate in the range of 60-90 mm/sec and if the high-speed switch 24c is operated, the pressure rollers are rotated at 90 mm/sec. In summary, good images can be obtained if the user operates an appropriate one of the switches 24 according to the type of the base material of the image transfer sheet to control the speed of the pressure rollers.

Although speed-controlling switches were disclosed above, this is not intended to limit the scope of the present invention. Alternatively, switches may be provided for inputting the type of the image transfer sheet (or the base sheet thereof), with preferred values of their speed through the compression device preliminarily stored in the RAM 23 such that the user has only to key-input the type of the image transfer sheet to determine the speed of rotation of the pressure rollers.

According to still another variation of the embodiment of the present invention described above, a detector may be provided for detecting a characteristic of the image transfer sheet being used such that the speed of rotation of the pressure rollers can be determined according to the output from such a detector indicative of the detected characteristic of the sheet. In practical applications, both a detector for detecting the thickness of the image transfer sheet and another detector for detecting whether the base material is ordinary paper or a transparent OHP original sheet.

Examples of method for detecting the thickness of an image transfer sheet include the following:

(1) The method of measuring the electrostatic capacity of the image transfer sheet and detecting its thickness from this measured result;

(2) The method of measuring the electrical resistance of the image transfer sheet and detecting its thickness from this measured result; and (3) The method of measuring the light transmissivity of the image transfer sheet and detecting its thickness from this measured result.

Figure 5:
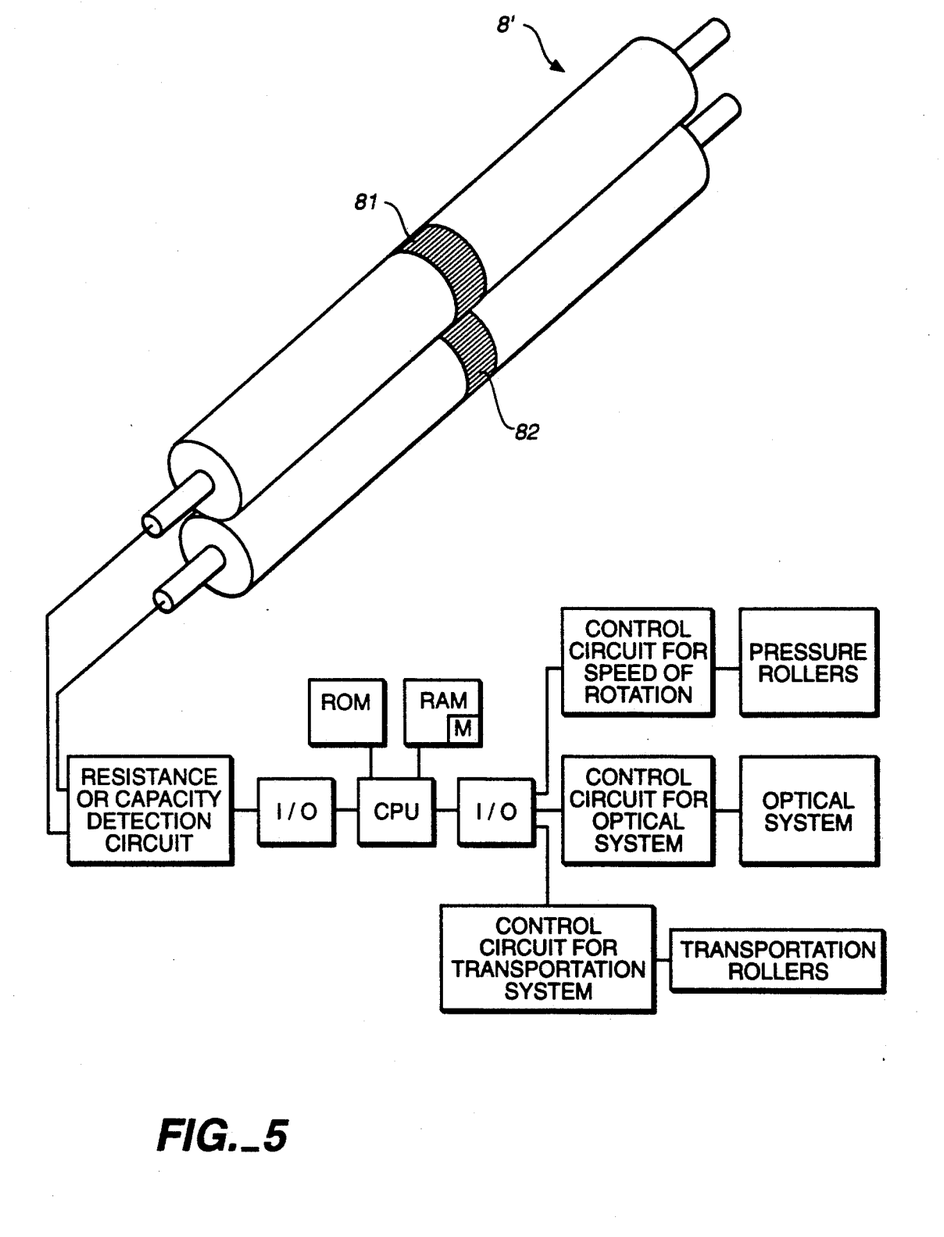
FIG. 5 is a schematic drawing showing an example of method for detecting characteristics of an image transfer sheet, FIGS. 6A and 6B each show another example of method for detecting characteristics of an image transfer sheet.
Figure 6A:
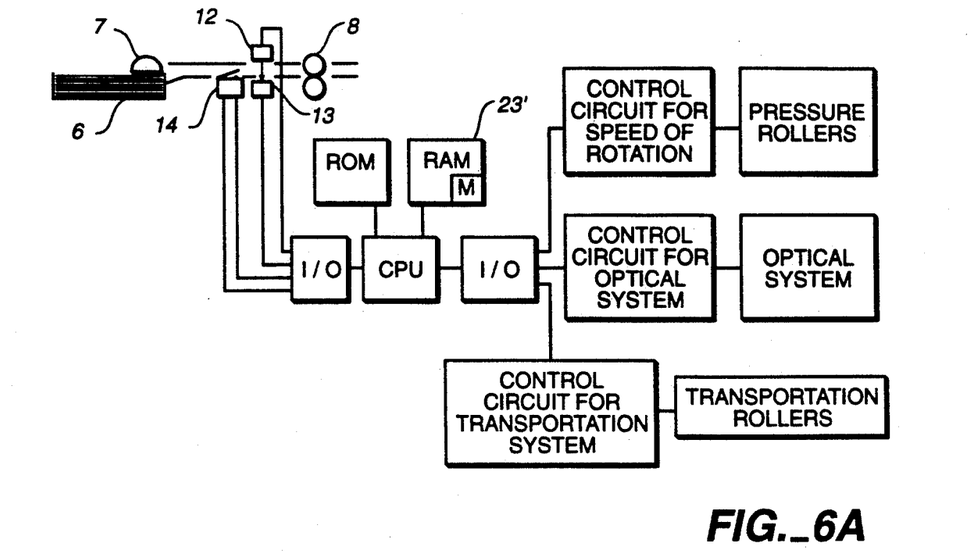

The greater the thickness of the image transfer sheet, the higher becomes its electrostatic capacity measured by the first method (1), the higher becomes its resistance measured by the second method (2) and the lower becomes its light transmissivity measured by the third method (3). The first and the second of these methods (1) and (2) can be effected by providing conductive sections 81 and 82, as shown in FIG. 5, to the timing rollers 8' for transporting the image transfer sheet so as to contact this image transfer sheet as the sheet is transported therebetween such that the electrostatic capacitance or electrical resistance between these conductive sections can be measured. The third method (3) can be effected, for example, by providing a transmissive photosensor including a light-emitting element 12 and a light-receiving element 13 as shown in FIG. 6A on the way along which the image transfer sheet is transported such that the amount of light passing through the sheet as it is transported can be measured. A microswitch 14 may be provided in front of the photosensor such that light is emitted from the light-emitting element when this microswitch 14 is switched on.

Examples of method for determining whether the base material of the image transfer sheet is ordinary paper or a transparent OHP original sheet include the following, based on the characteristics of the OHP original sheets:

(1') The method of measuring the light transmissivity of the sheet; and (2') The method of measuring the light reflectivity of the sheet.

Figure 6B:
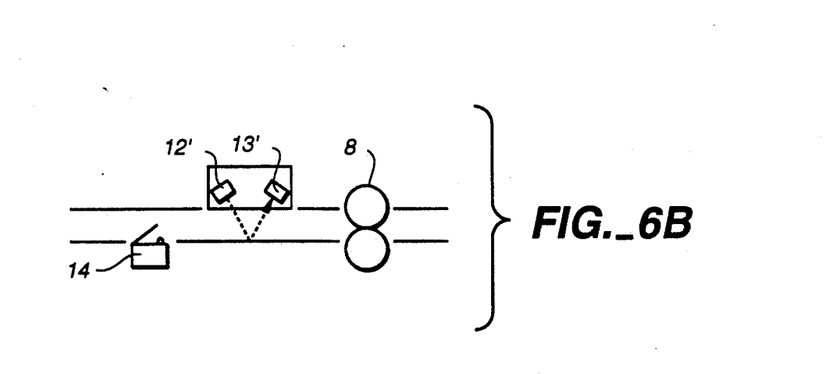

Transparent OHP original sheets have the characteristics of higher light transmissivity and lower light reflectivity than ordinary paper. The first method (1') by measuring light transmissivity can be effected by means of a transmission-type photosensor shown in FIG. 6A. The second method (2') by measuring light reflectivity can be effected as shown in FIG. 6B by placing a light emitting element 12' and a light receiving element 13', similar to those shown at 12 and 13 in FIG. 6A, on the same side of the path traveled by the image transfer sheet such that light emitted from the light emitting element 12' and reflected by the image transfer sheet can be received by the light receiving element 13'.

When the characteristics of the image transfer sheet (thickness and whether its base material is ordinary paper or transparent OHP original sheet) are thus detected, the detected result is inputted to the CPU 21. Area M of the RAM 23' contains rotation control data for the pressure rollers (or values of the speed at which the image transfer sheet is to be transported past the compression device) according to the kind of the sheet such that the rotation control data corresponding to the inputted type of the image transfer sheet are outputted and the pressure rollers are rotated at the speed indicated by the outputted data. A good image can therefore be formed on the image transfer sheet according to its type. In summary, with a detector provided for determining the type of the image transfer sheet, the trouble of inputting the rotational speed of the pressure rollers and the type of the image transfer sheet can be eliminated. The operator errors caused by forgetting to make a required input can be avoided and high-quality images can be dependably formed on transfer sheets of all kinds.

Figure 7:
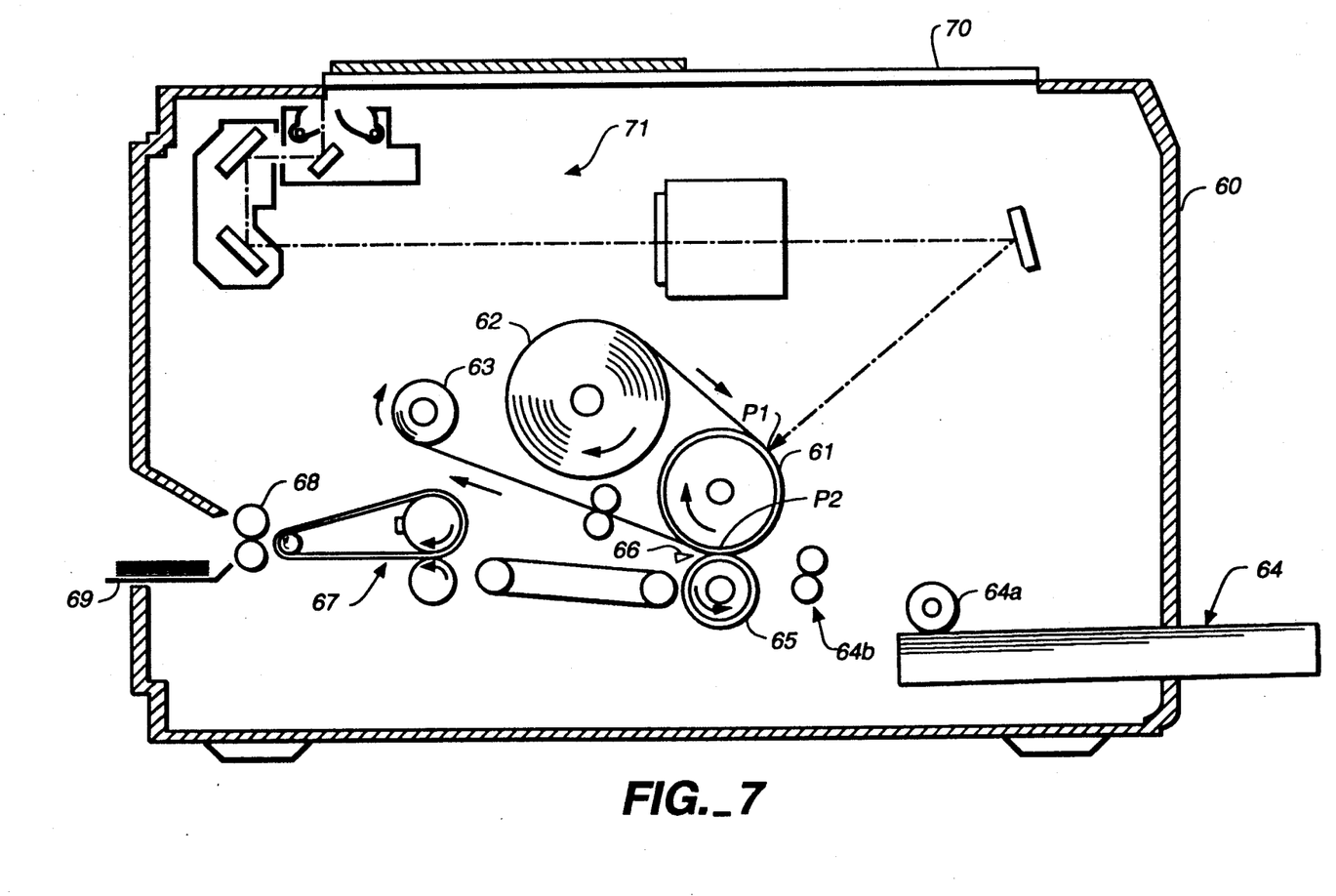
FIG. 7 is a schematic frontal sectional view for showing the structure of another image forming apparatus embodying the present invention.

The present invention is further explained by way of another example. As shown in FIG. 7, another image forming apparatus embodying the present invention contains a main drum 61 approximately at the center of its housing structure 60 and a roll 62 of photosensitive sheet is disposed thereabove and at its side. As in the example described above, the photosensitive sheet has a sheet-like base material with one surface coated with microcapsules encapsulating a colorless dye and a light-curable agent which hardens upon exposure to light. This photosensitive sheet is pulled from the roll 62 and is wound half-way around the main drum 61 with its microcapsule-coated surface facing outwardly. After passing half-way around the main drum 61, the photosensitive sheet is wound up around a take-up roller 63.

Provided on the top surface of the housing structure is a document table 70, below which there is an optical system including a light source, mirrors and a lens. A paper cassette 64 is provided on one side of the housing structure for storing and placing image transfer sheets therein. The image transfer sheets, like those described above, are comprised of a sheet-like base material with one surface coated with a developing agent having a chromogenic effect on the colorless dye encapsulated in the microcapsules as well as a thermoplastic resin material. The image transfer sheets inside the cassette 64 are transported one sheet at a time by a feed roller 64a to timing rollers 64b which serve to deliver them sequentially to the main drum 61. Below the main drum 61 is a pressure roller 65 in contact with the main drum 61 through the photosensitive sheet which is wound half-way around the main drum 61. A claw-like sheet separator 66 is disposed near the contact point between the main drum 61 and the pressure roller 65. The image transfer sheet is delivered into the gap between the photosensitive sheet wrapped around the main drum 61 and the pressure roller 65 so as to be superposed on top of the photosensitive sheet and be compressed together therewith by the pressure roller 65. The sheet separator 66 serves to separate the compressed image transfer sheet away from the photosensitive sheet. After thus separated from the photosensitive sheet, the image transfer sheet is transported to a heating device 67 and is thereafter discharged into a discharge section 69 by means of discharge rollers 68.

Figure 8:
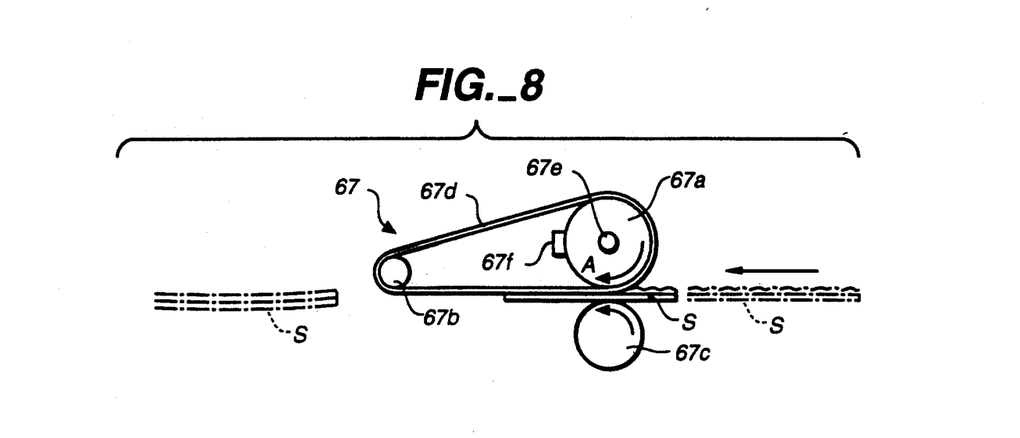
FIG. 8 is a schematic drawing of the heating device of the apparatus of FIG. 7.

As shown in FIG. 8, the heating device 67 is comprised of a heat roller 67a enclosing a heat lamp 67e therein and a tension roller 67b disposed on the downstream side of the heat roller 67a along the direction of transportation of the image transfer sheet S. An endless belt 67d is engagingly wrapped around and between the heat roller 67a and the tension roller 67b so as to rotate in the direction of the arrow A as the rollers 67a and 67b are turned.

A pressure roller 67c is provided and is compressed against the heat roller 67a. A temperature sensor 67f is disposed near and opposite to the surface of the heat roller 67a so as to detect the surface temperature of the heat roller 67a and to thereby have a temperature controller (not shown) to control the surface temperature of the heat roller 67a. Where the endless belt 67d is in contact with the heat roller 67a, its temperature rises nearly to the level of the heat roller 67a but as the belt 67d rotates and the contacting part moves away from the surface of the heat roller 67a, it cools down gradually. The temperature of the endless belt 67d when it comes to the position of the tension roller 67b should preferably be more than 20° C. lower than when it was in contact with the heat roller 67a. What is known as an offset tends to occur if the temperature drop is less.

To explain the image formation process by the apparatus described above, the optical system with its light source scans an original document on the document table 70 to be copied and light reflected therefrom is directed to an exposure point P1 on the microcapsule-coated surface of the photosensitive sheet wrapped around the main drum 61. This causes exposed microcapsules to be hardened and a latent image is thereby formed on the photosensitive sheet. An image transfer sheet is delivered from the cassette 64 by means of the feed roller 64a until it comes into contact with the timing rollers 64b and is temporarily stopped.

The pressure roller 65 below the main drum 61 is pressed by means of a compression mechanism (not shown) against the main drum 61 with the photosensitive sheet sandwiched in between at a pressure point P2. The pressure point P2 at which the pressure roller 65 is pressed against the main drum 61 through the photosensitive sheet is also the point at which the microcapsule-coated surface of the photosensitive sheet and the developing agent-coated surface of the incoming image transfer sheet are superposed one on top of the other and are compressed together. The image transfer sheet which has been temporarily stopped at the timing rollers 64b is delivered thereby to the pressure point P2 with the timing so selected that its front edge comes to coincide with the front edge of the area on the photosensitive sheet where the latent image has been formed. When the photosensitive sheet and the image transfer sheet are pressed together in this manner, those of the microcapsules which have not been hardened are ruptured, causing the colorless dye encapsulated therein to flow out thereof to start a chromogenic reaction with the developing agent on the image transfer sheet. Thereafter, the image transfer sheet is separated from the photosensitive sheet by the separator 66 and is transported to the heating device 67 by means of a suction belt.

With a chromogenically formed image thereon, the image transfer sheet with its surface coated also with a thermoplastic resin is delivered into the gap between the heat roller 67a and the pressure roller 67b such that the resin-coated surface of the image transfer sheet is opposite to the endless belt 67d. The sheet S is compressed by the pressure roller 67c while being heated by the heat roller 67a and the belt 67d. This causes the thermoplastic resin to soften or melt and it is made sufficiently smooth and flat by the flat surface of the belt 67d. As the sheet S is further transported by the belt 67d, the belt 67d becomes gradually cooler and the sheet S also becomes gradually cooler until it is removed therefrom to be transported towards the discharge rollers 68. If the temperature of the belt 67d as it passes the tension roller 67b is lower by 20° C. or more than that when the belt 67d is in contact with the heat roller 67a, there is no occurrence of offset and the sheet S can be removed easily from the belt 67d. The image transfer sheet S which has been thus made lustrous is thereafter discharged into the discharge section 69 by means of the discharge rollers 68.

Figure 9:
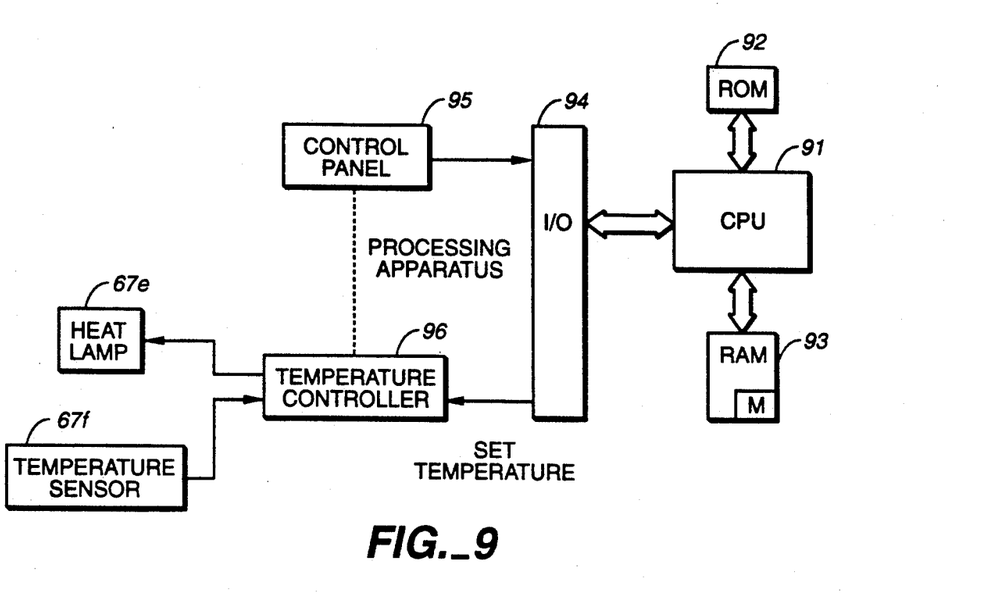
FIG. 9 is a block diagram of the control system of the image forming apparatus of FIG. 8.

As shown by FIG. 9 which is a block diagram of the control system of the image forming apparatus described above, the overall control of the apparatus is carried out by a central processing unit (CPU) 91 connected to a read-only memory (ROM) 92 and a random-access memory (RAM) 93 as well as a control panel 95, other processing units and a temperature controller 96 through an I/O interface 94. The heat lamp 67e and the temperature sensor 67f of the heating device 67 are connected to this temperature controller 96. The ROM 92 stores the program by which the CPU 91 controls the operation of the apparatus and the RAM 93 serves as a working area in the execution of this operation program. The area denoted by M of the RAM 93 preliminarily stores data on the relationship between the material characteristics and thickness of the image transfer sheet and the temperature of the heating device 67. The control panel 95 connected to the CPU 91 through the I/O interface 94 is disposed on the top surface of the housing structure of the apparatus and material characteristics and thickness of the image transfer sheet are inputted by operating keys (such as numeric keys) provided thereon. When data inputted through the control panel 95 are received by the CPU 91 through the I/O interface 94, the CPU 91 calculates a temperature value to be set on the basis of the aforementioned relationship stored in the area M of the RAM 93 and transmits the calculated temperature value to the temperature controller 96 through the I/O interface 94. The temperature controller 96 thereupon adjusts the current supplied to the heat lamp 67e according to the received temperature value and the output from the temperature sensor 67f such that the heating temperature by the heat roller 67e is maintained at the set temperature level.

Figure 10:
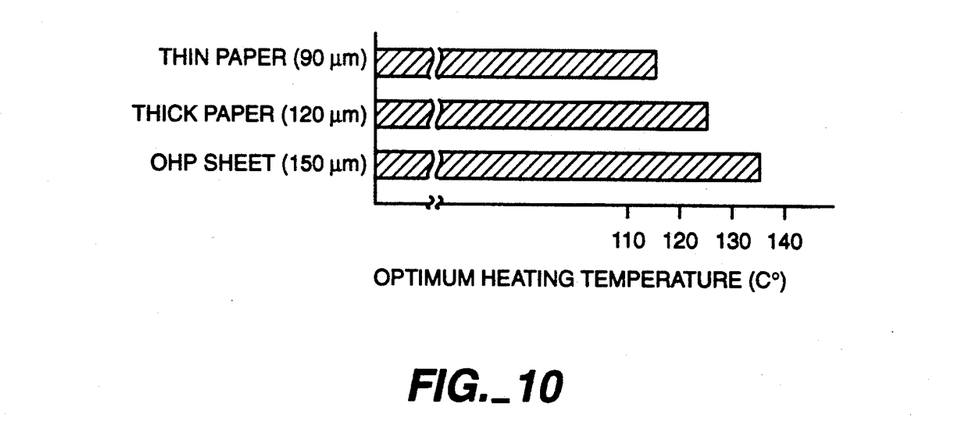
FIG. 10 is a graph showing the relationship between the characteristics of image transfer sheets and their optimum heating temperature.

If the traveling speed of the endless belt 67d of the heating device 67 is 20 mm/sec and the pressure applied by the pressure roller 67c is 4 kg/cm$^2$, the relationship between the material characteristics and thickness of the image transfer sheet and the optimum heating temperature becomes as shown in FIG. 10. If the base of the image transfer sheet is ordinary paper of thickness 90 μm, the optimum heating temperature is about 115° C. If the base of the image transfer sheet is ordinary paper of thickness 120 μm, the optimum heating temperature is about 125° C. If the base of the image transfer sheet is a transparent OHP original sheet of thickness 150 μm, the optimum heating temperature is about 135° C. The temperature controller 96 controls the heat lamp 67e on the basis of data on the thickness and material characteristics of the base material inputted through the control panel 95 such that the aforementioned optimum heating temperature is maintained. As explained above in connection with the copier shown in FIG. 1, the apparatus shown in FIG. 7 and explained above may also be so modified that the material characteristics and thickness of the base material for the image transfer sheet are detected by detectors after the sheet has been fed and that the heating temperature is automatically set according to the output signals from such detectors.

Figure 11:
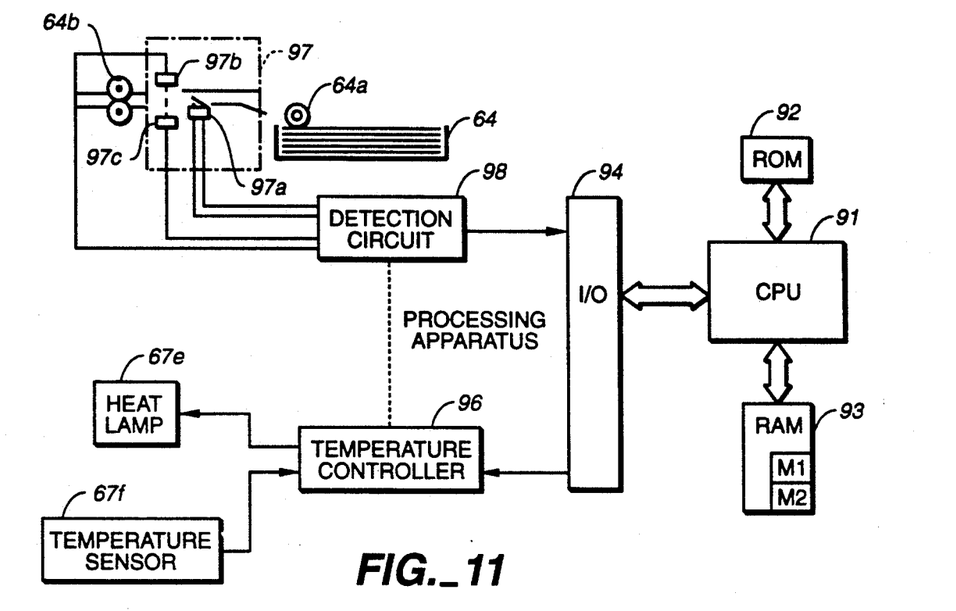
FIG. 11 is a schematic drawing with a block diagram for a part of an image forming apparatus using a light-transmissivity detector to determine the characteristics of image transfer sheets.

FIG. 11 shows schematically an image forming apparatus according to the present invention adapted to set the heating temperature of its heating device 67 by using a detector of light transmissivity to determine the material and thickness of the base of the image transfer sheet. Instead of the control panel 95 shown in and explained in connection with FIG. 9, there is provided a light transmissivity detector 97. This detector 97 is disposed between the feed roller 64a for transporting an image transfer sheet from its cassette 64 to the timing rollers 64b and may be comprised of a light emitting element 97b, a light receiving element 97c and a sheet detection switch 97a, detecting the transmissivity of light by the light emitting and receiving elements 97b and 97c when the feeding of an image transfer sheet is detected by the sheet detection switch 97a. The transmissivity detector 97 is connected to the I/O interface 94 through a detector circuit 98 such that both the detection signal by the light emitting and receiving elements 97b and 97c and the sheet detection signal from the sheet detection switch 97a are amplified and converted into digital signals by the detector circuit 98 and inputted into the CPU 91 through the I/O interface 94. The CPU 91, upon receiving these input signals, makes reference to the relationship between the thickness and material characteristics of the transfer sheet and the light transmissivity stored in the area $M_2$ of the RAM 93 and calculates the thickness and the material characteristics of the image transfer sheet, setting the heating temperature on the basis of the relationship between the sheet characteristics and the heating temperature stored in the area $M_1$. If the light transmissivity is high, it is identified as a transparent OHP original sheet. If the light transmissivity is low, it is identified as ordinary paper. Small differences in the light transmissivity are used to calculate the thickness of the transfer sheet.

Figure 12:
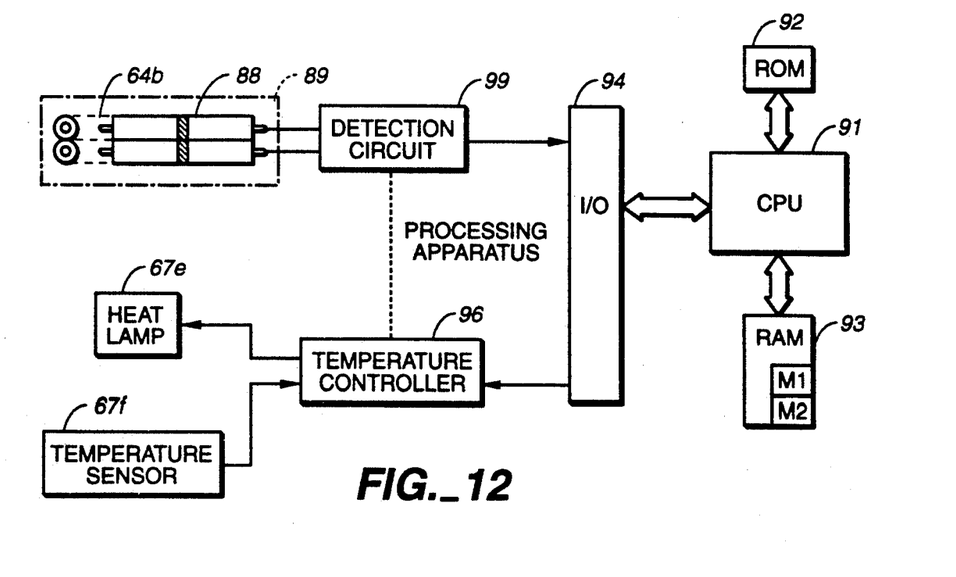
FIG. 12 is a schematic drawing with a block diagram for a part of an image forming apparatus using a electrostatic capacity detector to determine the characteristics of image transfer sheets.

FIG. 12 is a block diagram for an apparatus adapted to detect the characteristics of the image transfer sheet by using a detector 89 of electrostatic capacity. The capacity detector 89 is comprised of a pair of conductive sections 88 formed on the timing rollers 64b. These conductive sections 88 are formed so as to contact the front and back surfaces of the image transfer sheet which passes between the timing rollers 64b. The signal indicative of the electrostatic capacity of the image transfer sheet measured as it passes between the timing rollers 64b is amplified and converted into a digital signal by the detector circuit 88 and inputted into the CPU 91 through the I/O interface 94. This inputted detection signal is processed similarly as in the case of using a detector of light transmissivity described above to set the heating temperature.

The foregoing description of preferred embodiments of the invention has been presented for purposes of illustration and description. It is not intended to be exhaustive or to limit the invention to the precise forms disclosed, and many modifications and variations are possible in light of the above teaching. For example, the material characteristics of the image transfer sheet may be detected by measuring the reflectivity of light projected thereonto or by measuring its electrical resistance. The heating device need not be of a type using an endless belt. Heating devices of the oven type which use a heat for indirect heating, those of the heat roller type using a heat roller and a pressure roller may be substituted. Any such modifications and variations that may be apparent to a person skilled in the art are intended to be included within the scope of this invention.

What is claimed is:

1. In an image forming apparatus adapted to form an image by superposing an image transfer sheet over a photosensitive sheet, said photosensitive sheet having a surface of a sheet-like base material thereof coated with microcapsules encapsulating a light-curable agent and a colorless dye and said image transfer sheet having one surface of a sheet-like base material thereof coated with a developing agent having a chromogenic effect on said colorless dye, rupturing unhardened ones of said microcapsules by compressing said photosensitive sheet and said image transfer sheet superposingly together by means of a compressive device, and heating said image transfer sheet by means of a heating device, the improvement wherein said image forming apparatus comprises:

detecting means for detecting a thickness of said image transfer sheet, the detecting means including a measuring means for measuring a property of said image transfer sheet the property being selected from the group consisting of electrostatic capacity and electrical resistance; and     controlling means for controlling the speed of said image transfer sheet passing through said compression device according to said thickness of said image transfer sheet detected by said detecting means.

2. In an image forming apparatus adapted too form an image by superposing an image transfer sheet over a photosensitive sheet, said photosensitive sheet having a surface of a sheet-like base material thereof coated with microcapsules encapsulating a light-curable agent and colorless dye and said image transfer sheet having one surface of a sheet-like base material thereof coated with thermoplastic resin together with a developing agent having a chromogenic effect on said colorless dye, rupturing unhardened ones of said microcapsules by compressing said photosensitive sheet and said image transfer sheet superposingly together by means of a compression device, and heating said thermoplastic resin of said image transfer sheet by means of a heating device for the purpose of glossing an image on said image transfer sheet, the improvement wherein said image forming apparatus comprises:

detecting means for detecting a thickness of said image transfer sheet, the detecting means including a measuring means for measuring a property of said image transfer sheet the property being selected from the group consisting of electrostatic capacity and electrical resistance; and     controlling means for controlling the heating temperature by said heating device according to the thickness detected by said detection means, said heating device being disposed downstream of said compression device with respect to the motion of said image transfer sheet.

3. In an image forming apparatus adapted to form an image by superimposing an image transfer sheet over a photosensitive sheet, said photosensitive sheet having a surface of a sheet-like base material thereof coated with microcapsules encapsulating a light-curable agent and a colorless dye and said image transfer sheet having one surface of a sheet-like base material thereof coated with a developing agent having a chromogenic effect on said colorless dye, rupturing unhardened ones of said microcapsules by compressing said photosensitive sheet and said image transfer sheet superposingly together by means of a compression device, and heating said image transfer sheet by means of a heating device, the improvement wherein said image forming apparatus comprises:

detecting means for detecting a thickness of said image transfer sheet wherein the means include measuring means for measuring electrostatic capacity of the image transfer sheet; and     controlling means for controlling the speed of said image transfer sheet passing through said compression device according to said thickness of said image transfer sheet detected by said detecting means.

4. In an image forming apparatus adapted to form an image by superimposing an image transfer sheet over a photosensitive sheet, said photosensitive sheet having a surface of a sheet-like base material thereof coated with microcapsules encapsulating a light-curable agent and a colorless dye and said image transfer sheet having one surface of a sheet-like base material thereof coated with a developing agent having a chromogenic effect on said colorless dye, rupturing unhardened ones of said microcapsules by compressing said photosensitive sheet and said image transfer sheet superposingly together by means of a compression device, and heating said image transfer sheet by means of a heating device, the improvement wherein said image forming apparatus comprises:

detecting means for detecting a thickness of said image transfer sheet wherein the means include measuring means for measuring electrostatic capacity of the image transfer sheet; and     controlling means for controlling the speed of said image transfer sheet passing through said compression device according to said thickness of said image transfer sheet detected by said detecting means.

* * * * *

UNITED STATES PATENT AND TRADEMARK OFFICE
CERTIFICATE OF CORRECTION

PATENT NO. : 5,208,628
DATED : May 4, 1993
INVENTOR(S) : Kunio Ohashi et al.

It is certified that error appears in the above-identified patent and that said Letters Patent is hereby corrected as shown below:

In col. 7, line 31, following the term "0.8" insert --.--.

In col. 10, line 11 and line 67, between "20°C" and "lower" delete ".".

In col. 13, line 25, delete "too" and add therefore --to--.

In col. 14, lines 44-45, delete the phrase "electrostatic capacity" and add therefore --electrical resistance--.

Signed and Sealed this

Twenty-fifth Day of January, 1994

Attest:

BRUCE LEHMAN

*Attesting Officer*  *Commissioner of Patents and Trademarks*